United States Patent
Ali et al.

(10) Patent No.: US 6,774,031 B2
(45) Date of Patent: Aug. 10, 2004

(54) METHOD OF FORMING DUAL-DAMASCENE STRUCTURE

(75) Inventors: Abbas Ali, Plano, TX (US); Kenneth J. Newton, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/732,665

(22) Filed: Dec. 8, 2003

(65) Prior Publication Data

US 2004/0121581 A1 Jun. 24, 2004

Related U.S. Application Data

(60) Provisional application No. 60/434,098, filed on Dec. 17, 2002.

(51) Int. Cl.[7] ............... H01L 21/4763; H01L 21/44
(52) U.S. Cl. ............ 438/638; 438/624; 438/640; 438/673; 438/687; 438/701; 438/636
(58) Field of Search ................... 438/622, 624, 438/636–640, 672–673, 687, 700–701

(56) References Cited

U.S. PATENT DOCUMENTS

| | | | | |
|---|---|---|---|---|
| 6,323,121 B1 | * | 11/2001 | Liu et al. | 438/633 |
| 6,426,298 B1 | * | 7/2002 | Chen et al. | 438/699 |
| 6,689,695 B1 | * | 2/2004 | Lui et al. | 438/700 |
| 2002/0081855 A1 | * | 6/2002 | Jiang et al. | 438/694 |
| 2002/0192945 A1 | * | 12/2002 | Nagahara | 438/637 |
| 2003/0003765 A1 | * | 1/2003 | Gibson et al. | 438/760 |
| 2003/0077897 A1 | * | 4/2003 | Tsai et al. | 438/633 |
| 2003/0157806 A1 | * | 8/2003 | Nagahara et al. | 438/694 |
| 2004/0084774 A1 | * | 5/2004 | Li et al. | 257/758 |

* cited by examiner

Primary Examiner—Thanh Nguyen
(74) Attorney, Agent, or Firm—Peter K. McLarty; W. James Brady, III; Frederick J. Telecky, Jr.

(57) ABSTRACT

A first dielectric layer (30) and a second dielectric layer (40) are formed over an etch stop layer (20). A hardmask layer (50) is formed over the second dielectric layer and a via (62) is formed in the first dielectric layer (30) and the second dielectric layer (40). A trench (85) is formed mostly in the second dielectric layer (40) by fully or partially removing BARC from the via (62) are partially etching the trench (85) and prior to completion of the trench etch process.

9 Claims, 2 Drawing Sheets

METHOD OF FORMING DUAL-DAMASCENE STRUCTURE

This application claims priority under 35 USC § 119(e)(1) of provisional application Ser. No. 60/434,098, filed Dec. 17, 2002.

FIELD OF THE INVENTION

The present invention relates to a method for forming dual-damascene structures for metallization in integrated circuit fabrication.

BACKGROUND OF THE INVENTION

With high device speed demands for semiconductor integrated circuits there is a tremendous effort to reduce and minimize the resistor-capacitor (RC) delays that exist in sending signals between or along the metal lines that interconnect integrated circuits. To achieve the required low RC delays copper is used to form the metal interconnects and low k dielectric material is used to provide the isolation between the metal interconnects. Complex integrated circuits typically require multiple levels of copper interconnects separated by multiple levels of low k dielectric insulators. In forming the multiple levels of copper interconnect a damascene technique is most commonly used. In the damascene technique a dielectric (or low K dielectric) layer is first formed over the integrated circuit. A trench is formed in the dielectric layer that is filled with copper. Excess copper is removed using methods such as chemical mechanical polishing (CMP). To connect a copper metal line at one level of interconnect to another copper metal line positioned below, a via is formed in the intervening low k dielectric layer.

In integrated circuits requiring trenches and vias a modified damascene process often referred to as a dual damascene process can be used. In the dual-damascene process a via is first formed in multiple low k dielectric layers. A trench is then formed over the via in the top dielectric layer. The trench and via can then be simultaneously filled with copper to form a copper trench and via. A serious limitation in the use of the dual-damascene process is the formation of ridges and crowns in the low k dielectric layers during the trench etch process. The presence of the ridges and crowns will interfere with the formation of the subsequent copper interconnect trenches and vias causing a deterioration in circuit performance. There is therefore a need for a method to form dual-damascene structures without the formation of ridges and crowns.

SUMMARY OF INVENTION

The instant invention is a method for forming dual damascene structures on integrated circuits. The dual damascene structure is used to form copper structures that are used in the metal interconnects that comprise the integrated circuit. The method comprises forming an etch stop layer over the semiconductor substrate. First and second dielectric layers are formed over the etch stop layer and a hardmask layer is formed over the dielectric layers. A via is formed through both dielectric layers by etching. The via is partially filled with BARC and a trench is partially etched over the via. The BARC is fully or partially removed and the formation of the trench is completed. A liner material is formed in the via and trench and copper is used to fill the trench and via. Excess copper is removed using chemical mechanical polishing.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

The instant invention will be described with reference to FIGS. 1(a) to 1(e). The structures shown in the Figures represent metal interconnect structures formed as part of an integrated circuit. The underlying semiconductor substrate and devices fabricated in and above the substrate are not shown for clarity.

Figure 1A:
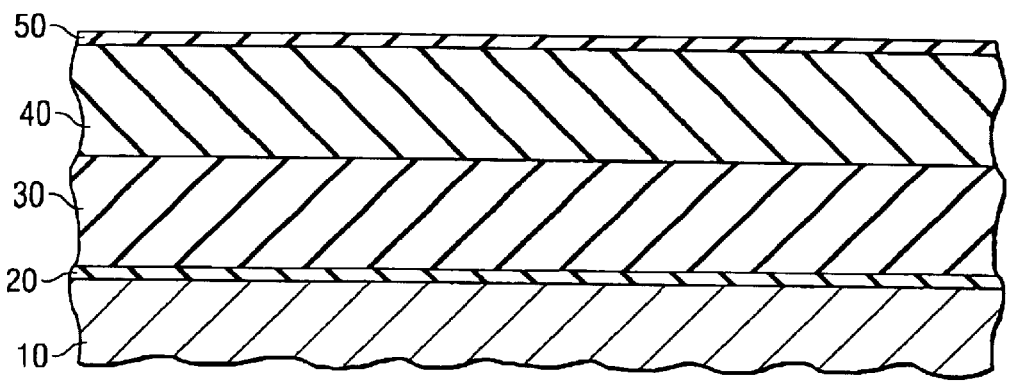
FIGS. 1(a) to 1(f) are cross-section diagrams showing an embodiment of the instant invention.

Shown in FIG. 1(a) is a copper layer 10 formed as part of the metal interconnecting lines that comprise an integrated circuit. The copper layer 10 is formed over a semiconductor substrate and there can be numerous other metal lines and dielectric layers interspersed between the copper layer 10 and the semiconductor substrate. Therefore copper layer 10 represents one of a plurality of metal layers that comprise the integrated circuit. As shown in FIG. 1(a) an etch stop layer is formed over the copper layer 10. The etch stop layer can comprise silicon nitride, silicon carbide, alternating layers of silicon carbide and silicon nitride, or any other suitable dielectric or insulating material. In the dual-damascene process a first dielectric layer 30 is formed over the etch stop layer 20. The first dielectric layer 30 will function as an interlevel dielectric (ILD) layer and can comprise silicon dioxide, various forms of spin on glass (SOG) such as siloxane SOG, silsesquioxanes, cage silsesquioxanes, and xerogels in addition to other suitable dielectric material. In general it is preferable that the first dielectric layer comprise a low K dielectric material which is defined here as a material having a dielectric constant less than that of silicon dioxide which is 3.9. A second dielectric layer 40 is formed over the first dielectric layer 30 as shown in FIG. 1(a). The second dielectric layer 40 will function as an intermetal dielectric (IMD) layer and can comprise silicon dioxide, various forms of spin on glass (SOG) such as siloxane SOG, silsesquioxanes, cage silsesquioxanes, and xerogels in addition to other suitable dielectric material. In general it is preferable that the second dielectric layer comprise a low K dielectric material which is defined here as a material having a dielectric constant less than that of silicon dioxide which is 3.9 A hardmask layer 50 is then formed over the second dielectric layer 40 as shown in FIG. 1(a). The hardmask layer can comprise silicon nitride, silicon carbide, alternating layers of silicon carbide and silicon nitride, or any suitable material.

Figure 1B:
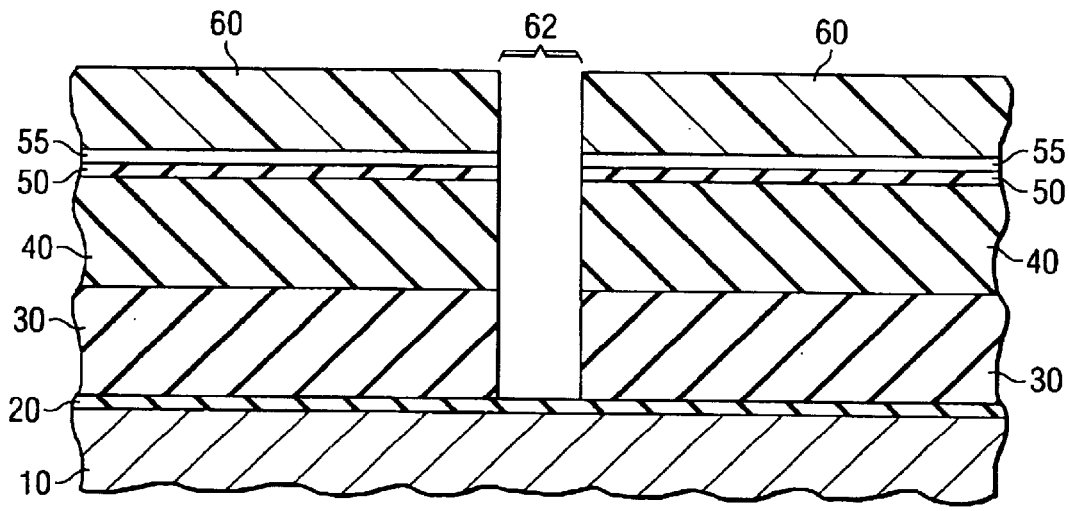

Following the formation of the dielectric stack structure shown in FIG. 1(a), a via 62 is etched in the ILD layer 30 and the IMD layer 40 as shown in FIG. 1(b). In etching the via 62, a backside anti reflective coating (BARC) layer 55 is formed on the hardmask layer 55 and a patterned photoresist layer 60 formed on the BARC layer 55. In forming the patterned photoresist layer 60, a blanket layer of photoresist 60 is first formed on the BARC layer 55. The blanket layer of photoresist is then patterned and developed to define the pattern that is used to etch the via 62. In a preferred embodiment the BARC layer 55, the hardmask layer 50, and the underlying dielectric layers 30 and 40 will be etched using a plasma etch process. In a preferred embodiment the plasma etch process used to etch the exposed region of the BARC layer 55 can comprise Ar, $O_2$, $CF_4$, and $N_2$ at power levels of 1000 to 1800 watts. The exposed region of the hardmask layer 50 can be etched using a plasma etch process comprising Ar, $O_2$, $CF_4$, $CHF_3$, and $N_2$ at power levels of 1000 to 1800 watts. In a preferred embodiment both the dielectric layer 30 and 40 can be etched using a plasma etch process comprising Ar, $O_2$, and any combination of $C_4F_8$, $C_5F_5$, CO, and $CF_4$ at power levels of 1000 to 1800 watts. The patterned photoresist layer 60 and the BARC layer 55 are removed following the via etch process.

Figure 1C:
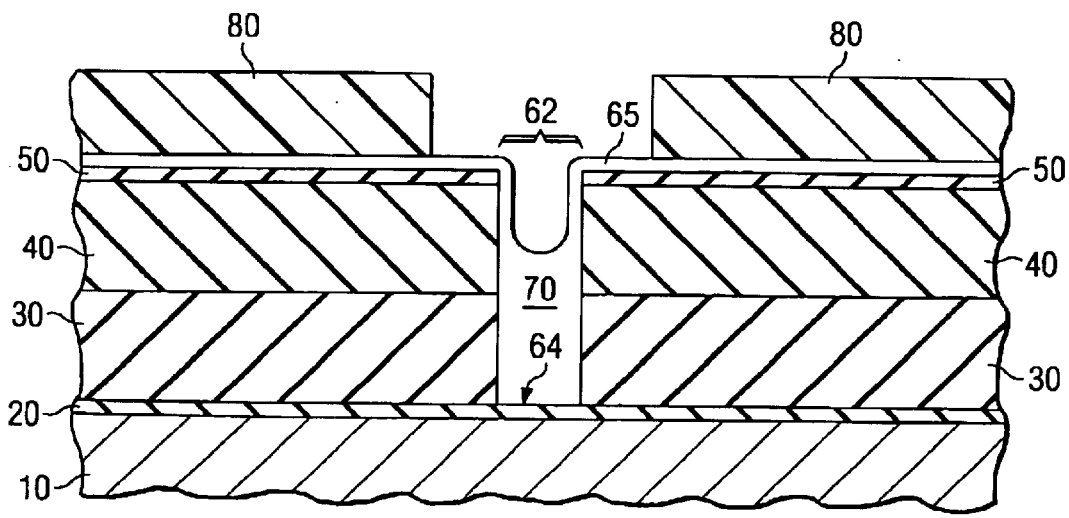
Figure 1D:
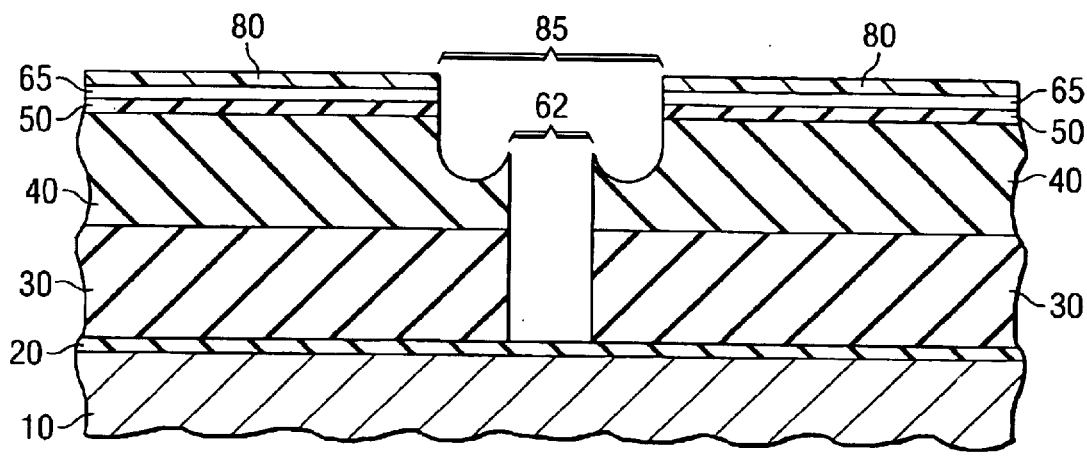
Figure 1E:
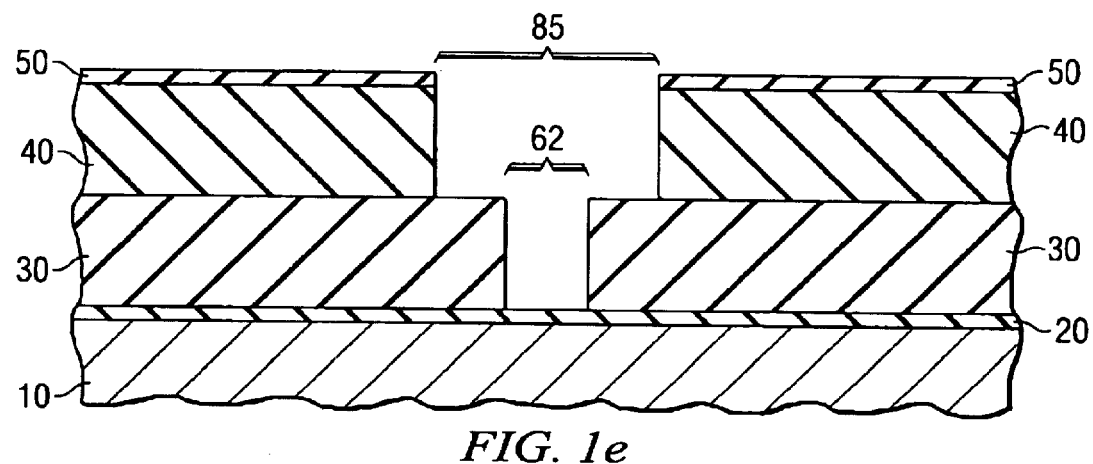
Figure 1F:
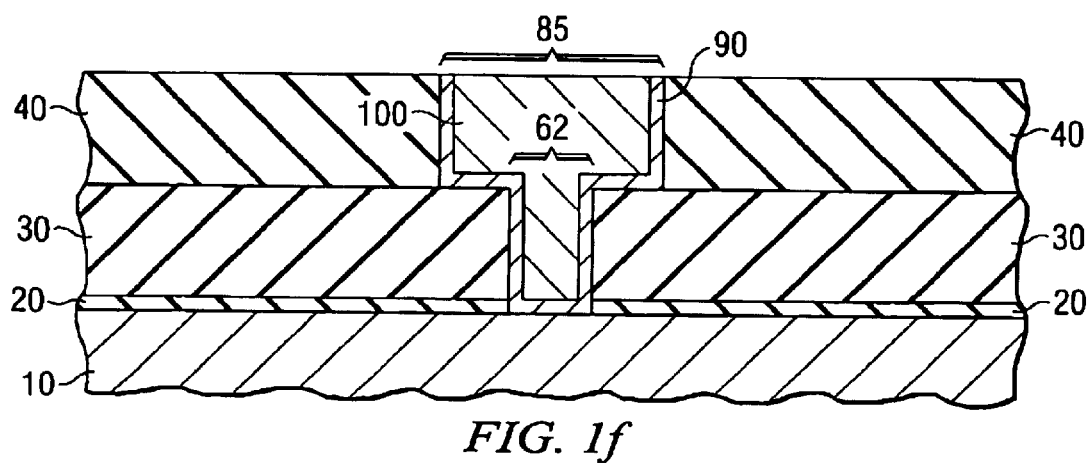

To protect the bottom surface 64 of the via 62 during the subsequent trench etch process, BARC 70 is used to fill a portion of the via 62 as shown in FIG. 1(c). During the via fill process BARC layers 65 are formed above the hardmask layer 50. As shown in FIG. 1(c), a patterned photoresist layer 80 is formed above the BARC layer 65 and will be used to define the trench during the trench etch process. Following the formation of the patterned photoresist layer 80, the trench 85 is partially etched into the IMD layer 40 as shown in FIG. 1(d). As shown in FIG. 1(d) the width of the trench 85 is greater than the width of the via 62. In a preferred embodiment a plasma etch process comprising Ar, $O_2$, $CF_4$, and $N_2$ at power levels of 1000 to 1800 watts can be used to etch the exposed region of the BARC layer 65. The exposed hardmask layer 50 can be etched using a plasma etch process comprising Ar, $O_2$, $CF_4$, $CHF_3$, and $N_2$ at power levels of 1000 to 1800 watts. In a preferred embodiment the IMD layer 40 can be partially etched using a plasma etch process comprising Ar, $O_2$, and any combination of $C_4F_8$, $C_5F_5$, CO, and $CF_4$ at power levels of 1000 to 1800 watts. Following the partial etching of the IMD layer 40, a plasma ash process is used to fully or partially remove the BARC 70 from the via 62. In a preferred embodiment the ash process comprises exposing the BARC to a plasma containing oxygen, nitrogen, hydrogen, or similar gas species. The ash process will also reduce the thickness of the patterned photoresist layer 80 as shown in FIG. 1(d). Following the plasma ash process the formation of the trench 85 is completed using a plasma etch process as shown in FIG. 1(e). During the plasma etch process that is used to complete the formation of the trench 85, the remaining photoresist and/or hardmask layer 50 will function as an etch mask and prevent unwanted etching of the IMD layer 40. In the structure of FIG. 1(e) it should be noted that the via 62 is formed mostly in the ILD layer 30 and the trench 85 will be formed mostly in the IMD layer 40. Thus a portion of the via 62 could extend into the IMD layer 40 and a portion of the trench 85 could extend into the ILD layer 30. Following the formation of the trench 85 and via 62, the exposed region of the etch stop layer 20 is removed using a plasma etch process. Copper 100 is then used to fill both the via 62 and the trench 85 forming a layer of metal interconnect as shown in FIG. 1(f). In an embodiment the copper conductor 100 is formed by first forming a liner layer 90 in the trench 85 and the via 62. In a preferred embodiment the liner 90 comprises titanium nitride or other suitable materials. Following the formation of the liner 90, copper is used to fill both the via 62 and the trench 85. Excess copper is removed using chemical mechanical polishing resulting in the copper structure 100 shown in FIG. 1(f). It should be noted that the copper in the via 62 provides an electrical connection between the copper in the trench 85 and the underlying copper layer 10. The method of the instant invention can be used to form any number of copper layers and vias in the fabrication of the integrated circuit.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

What is claimed is:

1. A method for forming a dual damascene structure, comprising:

forming an etch stop layer over a semiconductor substrate;

forming a first dielectric layer over said etch stop layer;

forming a second dielectric layer over said first dielectric layer;

forming a hard mask layer over said second dielectric layer;

etching a via of a first width through said first and second dielectric layers;

partially filling said via with BARC;

partially etching a trench of a second width in said second dielectric layer wherein said second width is greater than said first width and said trench is positioned over said via;

fully or partially removing said BARC from said via; and completing said etching of said trench wherein said trench is formed mostly in said second dielectric layer.

2. The method of claim 1 wherein said first dielectric layer comprises low K dielectric material.

3. The method of claim 1 wherein said second dielectric layer comprises low K dielectric material.

4. The method of claim 1 wherein said hardmask layer comprises material selected from the group consisting of silicon nitride and silicon carbide.

5. The method of claim 5 wherein said removing said BARC comprises a plasma ash process.

6. The method of claim 1 further comprising:

forming a liner in said trench and via;

filling said via and trench with copper; and removing said excess copper using chemical mechanical polishing.

7. A method for forming a integrated circuit copper structure, comprising:

forming an etch stop layer over a semiconductor substrate;

forming a first low K dielectric layer over said etch stop layer;

forming a second low K dielectric layer over said first dielectric layer;

forming a hard mask layer over said second dielectric layer;

etching a via of a first width through said first and second dielectric layers;

partially filling said via with BARC;

partially etching a trench of a second width in said second dielectric layer wherein said second width is greater than said first width and said trench is positioned over said via;

fully or partially removing said BARC from said via; and completing said etching of said trench wherein said trench is formed mostly in said second dielectric layer;

forming a liner in said via and trench;

filling said via and trench with copper; and removing said excess copper using chemical mechanical polishing.

8. The method of claim 7 wherein said hardmask layer comprises silicon nitride.

9. The method of claim 7 wherein said removing said BARC comprises a plasma ash process.

* * * * *